(12) United States Patent
Matsuzawa et al.

(10) Patent No.: US 7,275,749 B2
(45) Date of Patent: Oct. 2, 2007

(54) SUBSTRATE SUPPORTING APPARATUS

(75) Inventors: Minoru Matsuzawa, Tokyo (JP); Tatsuro Yoshida, Tokyo (JP)

(73) Assignee: Sipec Corporation, Tokyo (JP)

( * ) Notice: Subject to any disclaimer, the term of this patent is extended or adjusted under 35 U.S.C. 154(b) by 368 days.

(21) Appl. No.: 10/751,478

(22) Filed: Jan. 6, 2004

(65) Prior Publication Data

US 2005/0023773 A1    Feb. 3, 2005

(30) Foreign Application Priority Data

Jul. 28, 2003    (JP)    ............................. 2003-281206

(51) Int. Cl.
*B23B 31/12*    (2006.01)
(52) U.S. Cl. .......................... 279/106; 279/3; 118/724; 269/21
(58) Field of Classification Search ............. 279/3, 279/106; 118/500, 724–730; 438/485, 800; 269/21; 451/287, 289, 388
See application file for complete search history.

(56) References Cited

U.S. PATENT DOCUMENTS

| | | | | |
|---|---|---|---|---|
| 4,869,481 A | * | 9/1989 | Yabu et al. ................... 269/21 |
| 5,421,595 A | * | 6/1995 | Cripe et al. ..................... 279/3 |
| 5,692,873 A | * | 12/1997 | Weeks et al. ................ 414/627 |
| 5,707,051 A | * | 1/1998 | Tsuji ........................... 269/21 |
| 5,717,482 A | * | 2/1998 | Akutsu et al. ................ 355/53 |
| 5,879,576 A | * | 3/1999 | Wada et al. ................... 216/91 |
| 5,883,932 A | * | 3/1999 | Chiba et al. ................... 378/34 |
| 5,896,877 A | * | 4/1999 | Pirker ......................... 134/153 |
| 5,999,589 A | * | 12/1999 | Chiba et al. ................... 378/34 |
| 6,095,582 A | * | 8/2000 | Siniaguine et al. .......... 294/64.3 |
| 6,435,492 B1 | * | 8/2002 | Behler et al. ................. 269/21 |
| 6,669,808 B2 | * | 12/2003 | Adachi et al. ........... 156/345.11 |
| 6,887,317 B2 | * | 5/2005 | Or et al. ...................... 118/728 |
| 2001/0052392 A1 | * | 12/2001 | Nakamura et al. ............ 156/345 |
| 2002/0134512 A1 | | 9/2002 | Adachi et al. |

OTHER PUBLICATIONS

Patent Abstracts of Japan, vol. 2002, No. 12, (Dec. 2, 2002)-& JP 2002 239965 A (Aug. 28, 2002) * English Abstract*.
Patent Abstracts of Japan, vol. 012, No. 397 (Oct. 21, 1988)-& JP 63 140546 A (Jun. 13, 1988) *English Abstract *.

* cited by examiner

*Primary Examiner*—Dana Ross
(74) *Attorney, Agent, or Firm*—Kratz, Quintos & Hanson, LLP

(57) ABSTRACT

A substrate supporting apparatus for supporting a substrate or wafer in a non-contact state by Bernoulli theorem is disclosed. The substrate supporting apparatus 1 comprises a housing 2, a rotatable chuck 3 which is disposed in the housing 2, which is provided at its central portion with a hollow 12 and which supports a substrate 6, and a cylindrical nozzle member 4 which is disposed in the housing 2, which has a nozzle hole 7 and which can vertically move in the hollow 12. A nozzle hole 7 is formed in a central portion of the nozzle member 4. Gas is discharged from a gas source 8 through the nozzle hole 7, thereby holding the substrate 6 by an upper surface of the chuck 3 in a non-contact state. When the substrate 6 is to be detached, the nozzle member 4 is moved upward while discharging gas from the nozzle hole 7, thereby floating the substrate 6.

7 Claims, 3 Drawing Sheets

SUBSTRATE SUPPORTING APPARATUS

FIELD OF THE INVENTION

The present invention relates to a substrate supporting apparatus used in a substrate processing apparatus which cleans a substrate such as a semiconductor wafer, which etches or removes a resist film, or which coats a substrate such as a semiconductor wafer with a resist film. The invention also relates to a substrate detaching method for detaching a substrate from the substrate supporting apparatus.

BACKGROUND OF THE INVENTION

In various producing processes for producing semiconductor devices, a single wafer type substrate supporting apparatus is used when a substrate such as a semiconductor wafer is cleaned, or when chemical liquid processing for etching is carried out, or when a substrate is coated with a resist film or the resist film is removed. As such a substrate supporting apparatus, there is a supporting apparatus for a wafer-like article as described in Japanese Registered Patent No. 3383584.

The supporting apparatus described in Japanese Registered Patent No. 3383584 has a supporting body which rotates around a rotation axis. The supporting body is provided at its upper surface with an annular nozzle, and gas is supplied to the nozzle, thereby supporting a wafer in a non-contact state by Bernoulli theorem. The supporting body is formed with a plurality of holes which extend to the upper surface of the supporting body, and studs are inserted into the holes respectively. When a wafer is to be detached from the supporting body, the studs are moved upwardly, a gap between the wafer and the supporting body is increased, and the wafer is taken out using a spoon tool.

In order to support a substrate such as a wafer, this conventional supporting apparatus is formed with an annular nozzle for supplying gas to a periphery of the wafer, a plurality of studs which can vertically move are provided for taking out the wafer and thus, a structure of the supporting apparatus becomes complicated.

Further, a large amount of gas to be supplied is required for supporting the substrate such as the wafer on the supporting apparatus.

SUMMARY OF THE INVENTION

Hence, it is an object of the present invention to simplify a structure of a gas supply nozzle which supports a wafer, to reduce an amount of gas to be supplied, and to make it easy to take out the wafer from the supporting apparatus.

A first aspect of the present invention provides a substrate supporting apparatus comprising a rotatable chuck which is provided at its central portion with a hollow and which supports a substrate, and a cylindrical nozzle member having a nozzle hole and capable of vertically moving in the hollow. According to the first aspect, the substrate is placed on the upper surface of the chuck, gas is discharged toward the underside of the substrate, thereby holding the substrate by the upper surface of the chuck in a non-contact state by the Bernoulli theorem. After the nozzle member is upwardly moved, a fork is inserted into a gap between the chuck and the substrate. Thus, the substrate can be detached easily.

According to a second aspect of the invention, in the substrate supporting apparatus of the first aspect, the nozzle hole is formed in a central portion of the nozzle member. With this aspect, since the gas can be discharged toward the periphery of the substrate underside from its central portion, it is possible, at small gas flow rate, to hold the substrate by the upper surface of the chuck in the non-contact state.

According to a third aspect of the invention, in the substrate supporting apparatus of the first aspect, a surface of the chuck which is opposed to the substrate with pawls projecting substantially in a perpendicular direction with respect to the surface, the pawls can move into a state in which the pawls abut against an outer periphery of the substrate and support the substrate, and into a state in which the pawls are separated from the outer periphery of the substrate. With this aspect, it is possible to reliably hold the substrate and to easily attach and detach the substrate.

According to a fourth aspect of the invention, in the substrate supporting apparatus of the first aspect, gas is discharged from the nozzle hole, and the substrate is held by an upper surface of the chuck in the non-contact manner. With this aspect, it is possible, at small gas flow rate, to hold the substrate by the upper surface of the chuck in the non-contact state.

According to a fifth aspect of the invention, in the substrate supporting apparatus of the first aspect, the apparatus further comprises means for upwardly moving the nozzle member, and the means upwardly moves the nozzle member while discharging gas from the nozzle hole. With this aspect, after the nozzle member is moved upward, the fork is inserted into the gap between the chuck and the substrate, and the substrate can easily be detached.

According to a sixth aspect of the invention, in the substrate supporting apparatus according to any one of the first to fifth aspects, further comprising a fork for holding the substrate, the fork is inserted between an underside of the substrate and the upper surface of the chuck after the nozzle member being upwardly moved while discharging gas from the nozzle hole, and when the discharge of the gas is stopped, the substrate is detached from the substrate supporting apparatus by being held on the fork. With this aspect, the substrate can easily be detached.

According to a seventh aspect of the invention, in the substrate supporting apparatus of the sixth aspect, the fork has a pair of finger portions, a distance between the pair of finger portions is greater than a diameter of the nozzle member. With this aspect, the fork can be inserted without being hindered by the nozzle member.

According to the present invention, it is possible to simplify structures of the chuck which supports the wafer and the nozzle member which supports gas.

Further, it is possible to reduce an amount of gas to be supplied for supporting the wafer. When a substrate having a different size is used, it is necessary to change the flow rate of gas. However, since the gas is injected from the nozzle formed in the central portion, it is unnecessary to largely change the flow rate.

It is possible to easily and reliably take the wafer out from the substrate supporting apparatus.

BRIEF DESCRIPTION OF THE DRAWINGS

FIG. 3 are explanatory views of operation carried out when a substrate is taken out from the substrate supporting apparatus of the invention, wherein

PREFERRED EMBODIMENT OF THE INVENTION

Figure 1A:
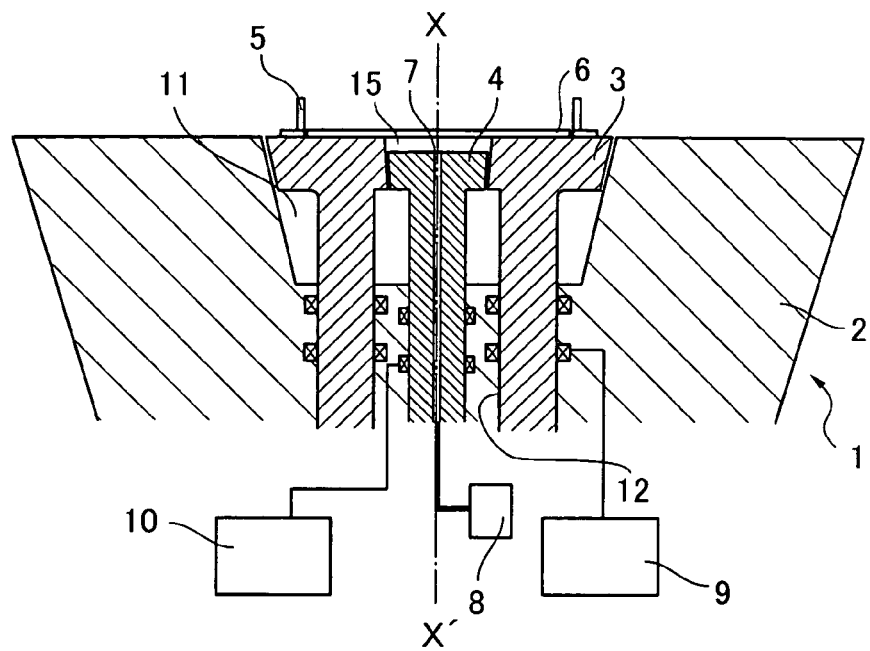
FIG. 1 show conception of an essential portion of a substrate supporting apparatus according to the present invention, wherein FIG. 1(*a*) is a partially cut-away side sectional view and FIG. 1(*b*) is a plan view.
Figure 1B:
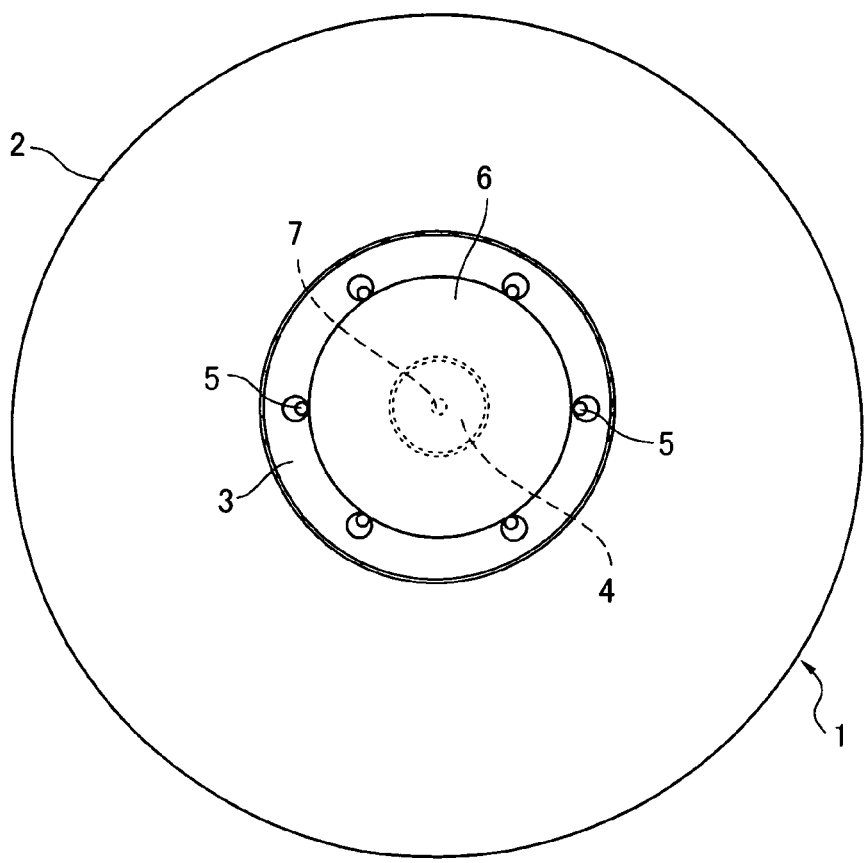

FIG. 1(a) is a partially cut-away side sectional view of an essential portion of a substrate supporting apparatus of the present invention and FIG. 1(b) is a plan view of the substrate supporting apparatus.

The substrate supporting apparatus 1 includes a housing 2, a hollow cylindrical chuck 3 which rotates around a rotation axis X-X' in the housing 2, and a columnar nozzle member 4 which is disposed in a hollow 12 of the chuck 3. The nozzle member 4 can vertically move. Upper portions of the chuck 3 and the nozzle member 4 are exposed from a recess 11 formed in the housing 2.

A plurality of pawls 5 are formed on an outer peripheral region of an upper surface of the chuck 3. The pawls 5 project substantially in the vertical direction. The pawls 5 support a periphery of a circular substrate 6 such as a semiconductor wafer. Each pawl 5 comprises a columnar body and a projection provided on an outer periphery of an upper surface of the columnar body. The pawls 5 are brought into two states by rotation of the columnar bodies, i.e., a state in which the projections abut against the outer periphery of the substrate 6, thereby supporting the substrate 6, and a state in which the projections are separated from the outer periphery of the substrate 6. The columnar bodies of the pawls 5 rotate in association with each other. In a state in which the substrate 6 is placed or mounted on a substrate-mounting surface of the upper surface of the chuck 3, the chuck 3 is rotated around the center axis X-X' by a motor 9.

The nozzle member 4 is provided at its central portion with a nozzle hole 7. Gas supplied from a gas (e.g., nitrogen gas) source 8 is discharged from the nozzle hole 7. The nozzle member 4 can vertically move in the chuck 3 by a vertically driving source 10.

Figure 2A:
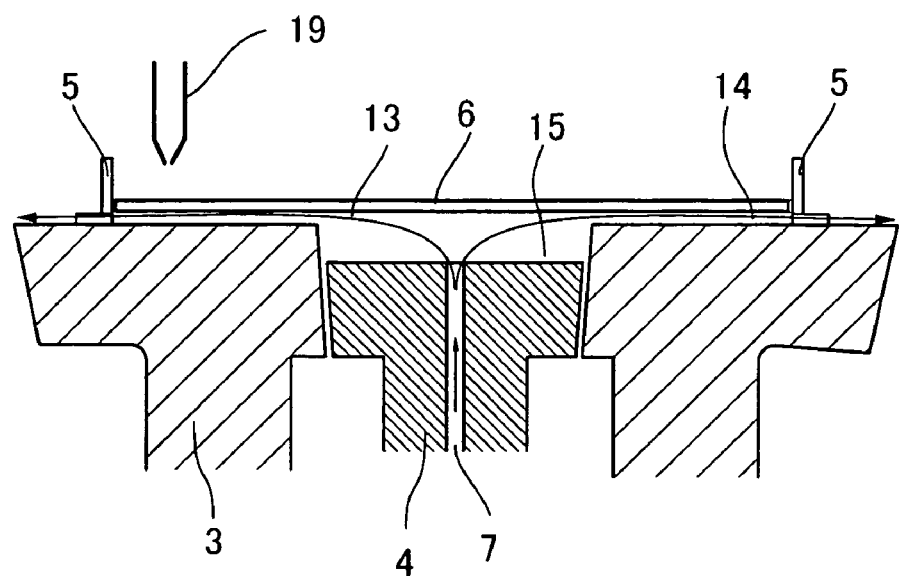
FIG. 2 are explanatory views of operation of the substrate supporting apparatus of the invention, wherein FIG. 2(*a*) is an enlarged side sectional view of a chuck and a nozzle member.
FIG. 2(b) shows pressure distribution in a substrate underside.

Next, the operation of the substrate supporting apparatus 1 will be explained. FIG. 2(a) is an enlarged side sectional view of the chuck and the nozzle member. As shown in FIG. 2(a), the substrate 6 is placed on the upper surface of the chuck 3, an upper surface of the nozzle member 4 is set lower than the upper surface of the chuck 3 and this state is maintained. In this state, if nitrogen gas 13 is injected from the nozzle hole 7 at a predetermined flow rate, the nitrogen gas 13 flows under the underside of the substrate 6 and passes through the recess 15 from the nozzle hole 7 and flows along a gap 14 between the substrate 6 and the upper surface of the chuck 3, and flows out from the periphery of the substrate 6.

Figure 2B:
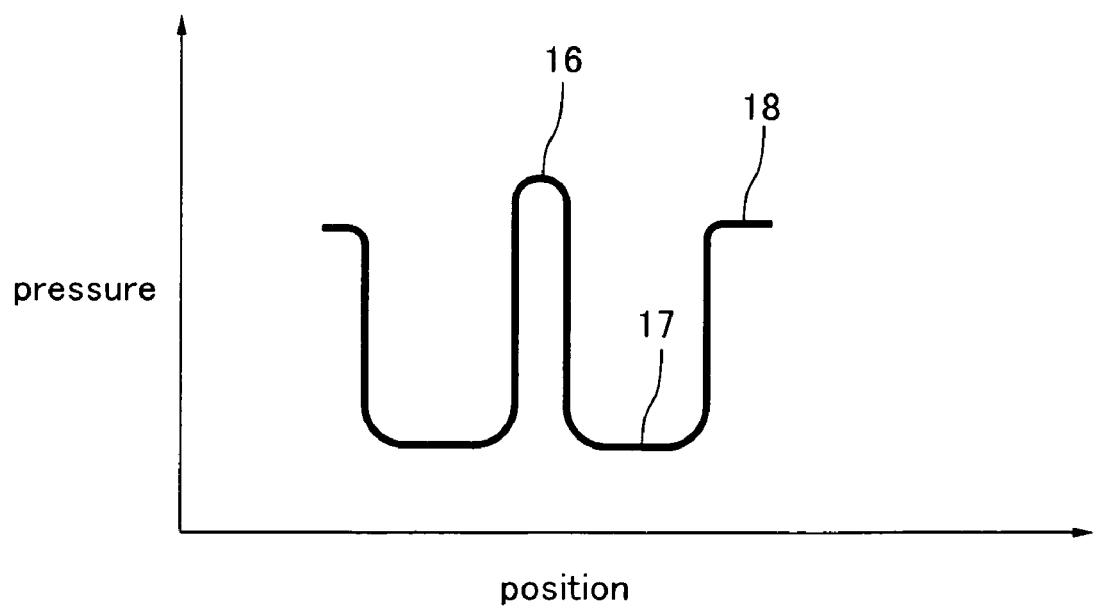

The nitrogen gas 13 which passes through the nozzle hole 7 passes through the recess 15. At that time, since the recess 15 is wider than the nozzle hole 7, the flow speed of the nitrogen gas 13 becomes slow. Then, the nitrogen gas 13 flows through the gap 14 between the substrate 6 and the upper surface of the chuck 3. Since the gap 14 is narrower than the recess 15, the flow speed of the nitrogen gas 13 becomes fast. Therefore, a distribution of the pressure on the back side of the substrate 6 is varied as shown in FIG. 2(b) by Bernoulli theorem. That is, at a central position of the back side of the substrate 6, the pressure is positive pressure 16, negative pressure 17 is formed at a position of the back side of the substrate 6 corresponding to the nozzle hole 7, and the negative pressure is turned into positive pressure 18 in the vicinity of the outer periphery of the substrate 6. As a result, the substrate 6 is drawn or sucked downward by the negative pressure 17 at its position corresponding to the recess 15, and is placed long the upper surface of the rotating chuck 3. In this state, cleaning liquid is allowed to flow to clean the substrate 6 while moving a nozzle 19 along the substrate 6 from above the substrate 6. If etching liquid is used instead of the cleaning liquid, it is possible to etch the substrate 6.

The flow rate of the nitrogen gas 13 is set to such a value that the substrate 6 can generate the negative pressure 17 by the Bernoulli theorem. The flow rate varies depending upon the size or the weight of the substrate 6, but if the substrate is a silicon wafer having a diameter of 200 to 300 mm and a thickness of 0.7 mm, the flow rate is preferably about 50 liters/minute.

Figure 3A:
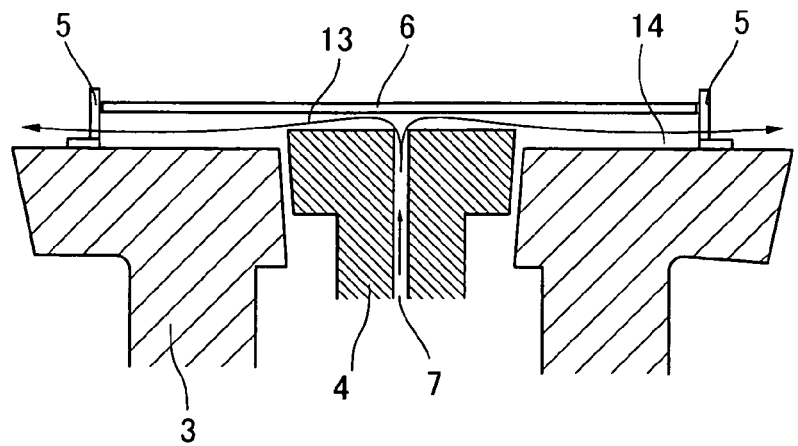
FIG. 3(a) is an enlarged side sectional view of the chuck and the nozzle member.
Figure 3B:
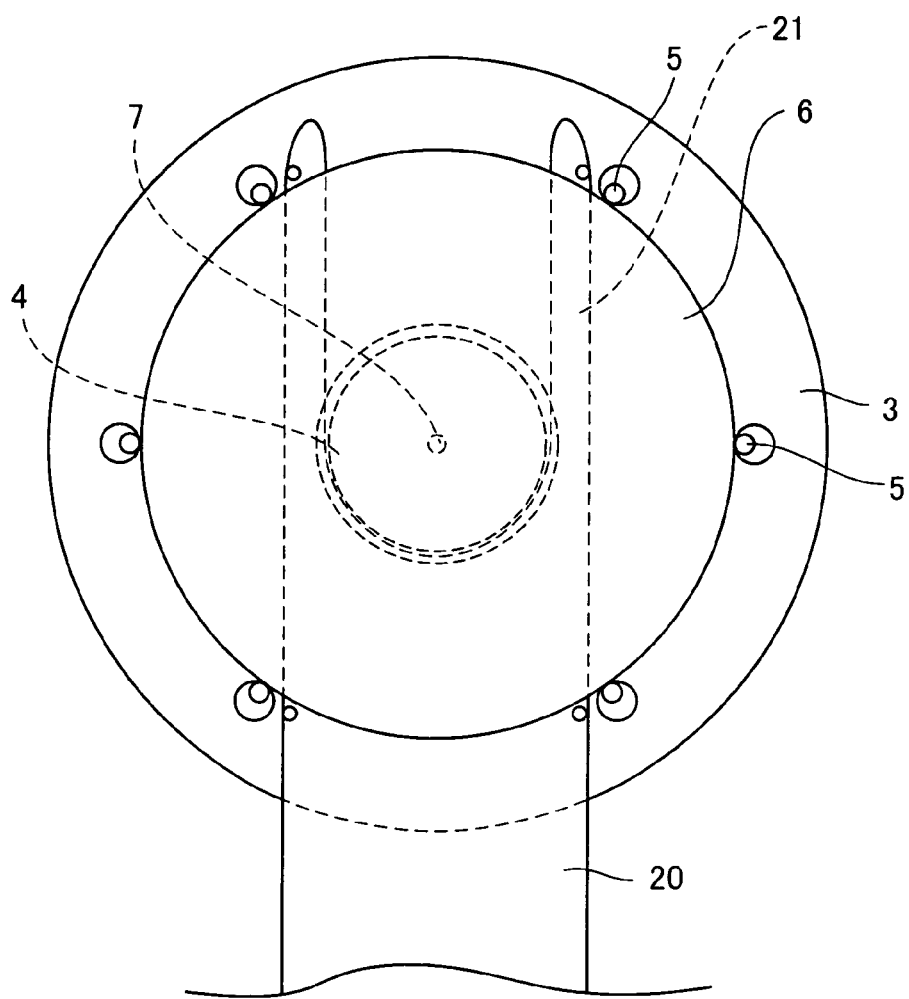
FIG. 3(b) is a plan view when a fork is inserted under the substrate underside.

After the cleaning or etching of the substrate 6 is completed, as shown in FIG. 3(a), if the nitrogen gas 13 is held discharged from the negative pressure 17 and the nozzle member 4 is moved upward, the substrate 6 floats and moves in the non-contact state while maintaining the drawn or sucked state of the substrate 6 toward the chuck 3 and the nozzle member 4. As a result, the gap 14 between the chuck 3 and the substrate 6 is increased, finger portions 21 of a fork 20 are inserted into the gap 14 as shown in FIG. 3(b), and if the discharging operation of the nitrogen gas 13 is stopped, the drawn or sucked state of the substrate 6 is released by the Bernoulli theorem, and the substrate 6 is supported by the fork 20. Thus, it is possible to place the substrate 6 on the fork 20 and to detach the substrate 6 from the substrate supporting apparatus 1.

The nozzle member 4 is moved to a position slightly higher than a position where a surface of the nozzle member 4 coincides with a surface of the chuck 3.

A distance between the pair of the finger portions 21 is slightly larger than a diameter of the nozzle member 4 so that the nozzle member 4 can enter between the finger portions 21. The thickness of the fork 20 is thin such that the fork 20 can be inserted into the gap 14.

As described above, the present invention is applied to cleaning of a substrate such as a semiconductor wafer, etching, removal of a resist film from the substrate and coating of resist film on the substrate.

What is claimed is:

1. A substrate supporting apparatus comprising:
    a housing with a recess formed therein for a rotatable chuck;
    the rotatable chuck, exposed from the recess of the housing, being provided at its central portion with a hollow and supporting a substrate, and
    a cylindrical nozzle member having a nozzle hole and being capable of vertically moving in the hollow of the rotatable chuck, and a gas supply source for supplying gas discharged out from said nozzle hole,
    wherein the substrate is held over an upper surface of the chuck in a non-contact state by discharging gas from said nozzle hole and wherein in a state where an upper surface of said nozzle member is held lower than an upper surface of said chuck, a recess serving as a gas flow path is formed in an upper portion of said nozzle hole.

2. The substrate supporting apparatus according to claim 1, wherein the nozzle hole is formed in a central portion of said nozzle member.

3. The substrate supporting apparatus according to claim 1, wherein a plurality of pawls are provided on a surface of said chuck which is opposed to said substrate, each of said plurality of pawls being projected substantially in a perpendicular direction with respect to said surface, each of said pawls can move into a state in which said pawls abut against an outer periphery of said substrate and support said substrate, and into a state in which the pawls are separated from the outer periphery of said substrate.

4. The substrate supporting apparatus according to claim 1, further comprising means for upwardly moving said nozzle member, said means upwardly moves said nozzle member while discharging gas from the nozzle hole.

5. The substrate supporting apparatus according to any one of claims 1 to 3 and 4, wherein further comprising a fork for holding said substrate, said fork is inserted between an underside of said substrate and the upper surface of said chuck after said nozzle member being upwardly moved while discharging gas from the nozzle hole, and when the discharge of the gas is stopped, said substrate is detached from said substrate supporting apparatus by being held on said fork.

6. The substrate supporting apparatus according to claim 5, wherein said fork has a pair of finger portions, a distance between said pair of finger portions is greater than a diameter of said nozzle member.

7. The substrate supporting apparatus according to claim 1, wherein the rotatable chuck is solid except for the central portion with the hollow.

* * * * *